US012464757B2

United States Patent
Nongaillard et al.

(10) Patent No.: US 12,464,757 B2
(45) Date of Patent: Nov. 4, 2025

(54) ELECTRONIC ASSEMBLY PROVIDED WITH A PLURALITY OF HIGH ELECTRON MOBILITY TRANSISTORS

(71) Applicants: STMicroelectronics France, Montrouge (FR); STMicroelectronics International N.V., Geneva (CH)

(72) Inventors: Matthieu Nongaillard, Grenoble (FR); Thomas Oheix, Grenoble (FR)

(73) Assignee: STMicroelectronics France, Montrouge (FR)

( * ) Notice: Subject to any disclaimer, the term of this patent is extended or adjusted under 35 U.S.C. 154(b) by 630 days.

(21) Appl. No.: 17/708,869

(22) Filed: Mar. 30, 2022

(65) Prior Publication Data

US 2022/0328681 A1 Oct. 13, 2022

(30) Foreign Application Priority Data

Apr. 7, 2021 (FR) .................................... 2103564

(51) Int. Cl.
*H10D 30/47* (2025.01)
*H01L 25/07* (2006.01)
(Continued)

(52) U.S. Cl.
CPC ......... *H10D 30/475* (2025.01); *H01L 25/074* (2013.01); *H10D 30/015* (2025.01); *H10D 64/519* (2025.01)

(58) Field of Classification Search
CPC ............... H01L 29/7786; H01L 25/074; H01L 29/4238; H01L 29/66462; H01L 29/4175;
(Continued)

(56) References Cited

U.S. PATENT DOCUMENTS

2013/0234207 A1   9/2013  Choi et al.
2014/0091366 A1*  4/2014  Jeon ..................... H10D 88/101
                                                     257/195
(Continued)

FOREIGN PATENT DOCUMENTS

JP          H10223835 A   *  8/1998

OTHER PUBLICATIONS

English translation of JPH10223835A (Year: 1997).*
Translation of JPH 10223835 A (Year: 1998).*

*Primary Examiner* — William B Partridge
*Assistant Examiner* — Ilker Ozden
(74) *Attorney, Agent, or Firm* — Seed Intellectual Property Law Group LLP (57) ABSTRACT

The disclosure concerns an electronic assembly which extends along a stacking direction from a lower surface to an upper surface coupled by an edge surface, the assembly comprises at least two elementary modules stacked along the stacking direction, which each comprise, along the stacking direction and from a back side to a front side, two high electron mobility transistors respectively called back transistor and front transistor, separated by an insulator layer, and having in common a source electrode, a drain electrode, and a gate electrode, the assembly of the front and back transistors being electrically connected in parallel, the electronic assembly comprises, arranged on the front side of each elementary module, a contact layer, electrically contacting the gate electrode of the considered elementary module from its front side, each of the contact layers comprising an electric contact point emerging onto the edge surface.

20 Claims, 5 Drawing Sheets

(51) Int. Cl.
*H10D 30/01* (2025.01)
*H10D 64/27* (2025.01)

(58) Field of Classification Search
CPC ............ H01L 29/2003; H01L 29/7783; H01L 27/085; H10D 30/475; H10D 30/015; H10D 64/519; H10D 64/254; H10D 62/8503; H10D 84/82; H10D 30/4732
See application file for complete search history.

(56) References Cited

U.S. PATENT DOCUMENTS

| | | | |
|---|---|---|---|
| 2015/0069615 A1* | 3/2015 | Ohno | H10D 64/254 257/773 |
| 2015/0125995 A1 | 5/2015 | Lee et al. | |
| 2015/0263116 A1* | 9/2015 | Qiu | |
| 2017/0294528 A1* | 10/2017 | Ren | H01L 29/778 |

* cited by examiner

ELECTRONIC ASSEMBLY PROVIDED WITH A PLURALITY OF HIGH ELECTRON MOBILITY TRANSISTORS

CROSS REFERENCE TO RELATED APPLICATION(S)

This application is a translation of and claims the priority benefit of French patent application number 2103564, filed on Apr. 7, 2021, entitled "ELECTRONIC ASSEMBLY PROVIDED WITH A PLURALITY OF HIGH ELECTRON MOBILITY TRANSISTORS" which is hereby incorporated by reference to the maximum extent allowable by law.

BACKGROUND

Technical Field

The disclosure relates to the field of electronics, and more particularly of power electronics. More particularly, the present disclosure concerns an electronic assembly provided with a plurality of electronic devices formed of high electron mobility transistors.

The electronic assembly according to the present disclosure is for example arranged to allow a better integration of high electron mobility transistors.

The arrangement provided in the present disclosure enables in this regard to obtain a compact device enabling to increase the density of current likely to flow through said device with respect to a single high electron mobility transistor.

Description of the Related Art

High electron mobility transistors ("HEMT"), well known by those skilled in the art, are now widely implemented in the field of hyperfrequencies and that of switches for power electronics converters.

In this regard, HEMT transistors are generally elaborated from layers of III-V semiconductor materials and, in some implementations, III-N semiconductor materials.

BRIEF SUMMARY

The present disclosure concerns an electronic assembly which extends along a stacking direction from a lower surface to an upper surface coupled by an edge surface, the assembly comprises at least two elementary modules stacked along the stacking direction, which each comprise, along the stacking direction and from a back side to a front side, two high electron mobility transistors respectively called back transistor and front transistor, separated by an insulator layer, and having in common a source electrode, a drain electrode, and a gate electrode, the assembly of the front and back transistors being electrically connected in parallel, the electronic assembly comprises, arranged on the front side of each elementary module, a contact layer, electrically contacting the gate electrode of the considered elementary module on its front side, each of the contact layers comprising an electric contact point emerging onto the edge surface.

According to an implementation mode, a contact layer interposed between two elementary modules called, according to the stacking direction, first module and second module, also contacts, on the back side of the second module, the gate electrode of said second module.

According to an implementation mode, said electronic assembly comprises source connection means and drain connection means arranged to connect in parallel all the front transistors and the back transistors.

According to an implementation mode, the source connection means comprise source pads, each source pad being interposed between two adjacent electronic modules to electrically connect the source electrodes of the considered electronic modules.

According to an implementation mode, the drain connection means comprise drain pads, each drain pad being interposed between two adjacent electronic modules to electrically connect the drain electrodes of the considered electronic modules.

According to an implementation mode, the front transistor and the back transistor respectively comprise a front stack and a back stack, the front stack comprising, from the insulator layer to the front side, a front barrier layer and a front channel layer, and the back stack comprising from the insulator layer to the back side a back barrier layer and a back channel layer, the front channel layer and the back channel layer being each capable of forming a conduction layer in the form of a two-dimensional electron gas.

According to an implementation mode, the front stack and the back stack are essentially identical.

According to an implementation mode, the front and back transistors have an identical threshold voltage.

According to an implementation mode, the front channel layer and the back-channel layer comprise GaN and the front barrier layer and the back barrier layer comprise an AlGaN ternary alloy.

According to an implementation mode, the insulator layer comprises a dielectric material, in some implementations, silicon dioxide or silicon nitride.

According to an implementation mode, the contact layer comprises a metal element, and in some implementations, the metal element comprises copper.

According to an implementation mode, said assembly also comprises a lower contact layer arranged on the back side of an elementary module, called lower module, the first one in the order of the elementary modules along the stacking direction, the lower contact layer is arranged to contact, on the back side, the gate electrode of the lower module.

BRIEF DESCRIPTION OF THE SEVERAL VIEWS OF THE DRAWINGS

Other features and advantages of the disclosure will appear from the following detailed description in relation with the appended drawings, in which.

DETAILED DESCRIPTION

Figure 1:
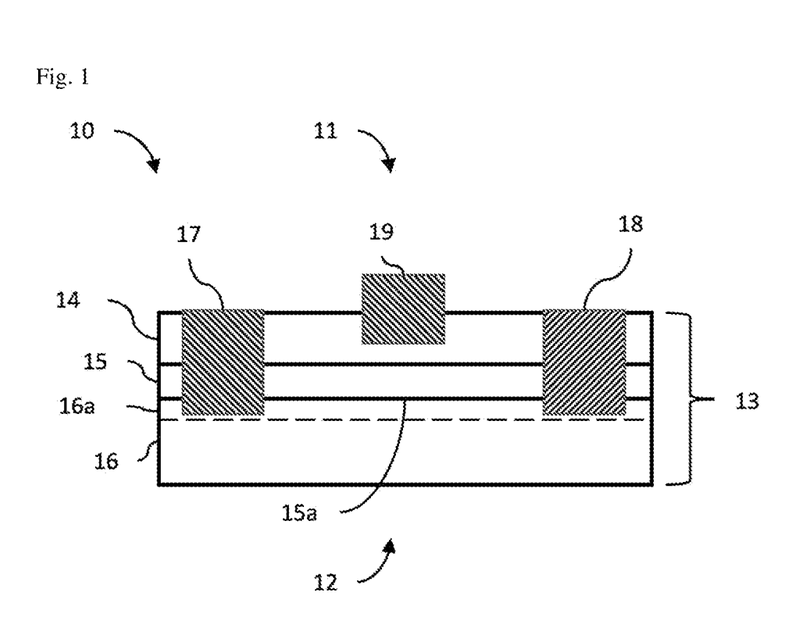
FIG. 1 is a simplified representation of a known HEMT transistor of the state of the art, for example the HEMT transistor is shown along a cross-section plane perpendicular to the front side.

FIG. 1 shows a HEMT transistor 10. This HEMT transistor 10 is provided with a stack 13 which comprises, from a front side 11 to a back side 12, an insulator layer 14, a barrier layer 15, and a channel layer 16 capable of forming a conduction layer 16a in the form of a two-dimensional electronic gas layer. In particular, conduction layer 16a extends in channel layer 16 from an interface 15a, formed between barrier layer 15 and said channel layer 16.

The III-V semiconductor materials selected to form barrier layer 15 and/or channel layer 16 may comprise gallium nitride (GaN), aluminum nitride (AlN), $Al_xGa_{1-x}N_x$ ternary alloys, gallium arsenide (GaAs), AlGaAs or InGaAs ternary alloys. For example, barrier layer 15 and channel layer 16 may respectively comprise an AlGaN compound and GaN. Insulator layer 14 may comprise a dielectric material, and for example silicon dioxide ($SiO_2$) or silicon nitride ($Si_3N_4$).

HEMT transistor 10 also comprises a source electrode 17 and a drain electrode 18 in electric contact with conduction layer 16a. For example, source electrode 17 and drain electrode 18 emerge through front surface 11, and cross insulator layer 14 and barrier layer 15 to reach interface 15a and electrically contact conduction layer 16a. Source electrode 17 and drain electrode 18 may partially or integrally cross conduction layer 16a. Source electrode 17 and drain electrode 18 may comprise a metal species, for example aluminum, filling trenches formed in stack 13.

HEMT transistor 10 also comprises a gate electrode 19 intended to be imposed a voltage Vg enabling to control the state of conduction layer 16a. For example, as soon as the electric potential difference between gate electrode 19 and source electrode 17, noted Vg–Vs (Vs being the electric voltage of the source electrode), is greater than a threshold voltage Vth characteristic of HEMT transistor 10, said transistor is in the conductive state. Conversely, as soon as Vg–Vs is smaller than Vth, HEMT transistor 10 is in the non-conductive state, and thus behaves as an off switch.

Thus, depending on the value of threshold voltage Vth, and for example on its sign, a HEMT transistor may be in depletion (normally-on) mode if its threshold voltage Vth is negative, or in enhancement (normally-off) mode if its threshold voltage Vth is positive.

Such a high electron mobility transistor however has an on-state resistivity Ron (Ron being the on-state drain/source resistance) which limits the intensity of the current likely to flow through the conduction layer.

In this regard, the main parameters influencing resistivity Ron are:
- the surface resistance of the channel layer;
- the resistance of the contacts between the conduction layer and the source and drain electrodes;
- the electric resistivities of the routing metals of the chips;
- the electric resistances induced in the final assembly having the high electron mobility transistor integrated therein.

To overcome this problem, it is possible to significantly decrease the resistivity Ron of a high electron mobility transistor by increasing the surface area thereof. There however exist situations for which the space available for the integration of a high electronic mobility transistor is constrained, so that such a solution cannot be envisaged.

As a variant, it may be considered to optimize the parameters influencing resistivity Ron. Such a solution however remains complex to implement, since it requires, on the one hand, a full resizing of the high electron mobility transistor, and on the other hand a reviewing of the method enabling to manufacture said transistor.

The present disclosure thus provides an assembly allowing a greater density of integration of high electron mobility transistors without however significantly increasing the space occupied by said device.

The present disclosure provides an assembly of a plurality of high electron mobility transistors arranged to limit the heating of said assembly.

It should be understood that the different drawings shown in relation with the present description are given as an illustration only and by no way limit the disclosure. It should be clear that the relative scales or dimensions may not be respected.

All throughout the description, it is admitted that a layer or an interface is generally planar and extends along a plane parallel to the (0, x, y) plane of the (0, x, y, z) orthonormal reference frame. Further, as soon as reference is made to a representation along a cross-section plane, the latter is perpendicular to all the planes formed by the layers, and in some implementations perpendicular to the (0, x, y) plane. It should also be understood that, as soon as reference is made to a stack of layers, the latter are stacked along the z direction of the (0, x, y, z) orthonormal reference frame.

The disclosure concerns an electronic assembly which extends along a stacking direction from a lower surface to an upper surface coupled by an edge surface. The assembly, for example, comprises at least two elementary modules stacked along the stacking direction, which each comprise, along the stacking direction and from a back side to a front side, two high electron mobility transistors respectively called back transistor and front transistor, separated by an insulator layer. Further, within each elementary module, the front transistor and the back transistor have in common a source electrode, a drain electrode, and a gate electrode. Further, all the front and back transistors are electrically connected in parallel. The electronic assembly comprises, arranged on the front side of each elementary module, a contact layer, electrically contacting the gate electrode of the considered elementary module on its front side, each of the contact layers comprising an electric contact point emerging onto the edge surface.

It should be understood that a stacking direction also defines a "direction." In other words, and in the context of the present disclosure, the stacking direction is oriented from the lower surface to the upper surface or equivalently from the back side to the front side.

According to the present disclosure, transistors connected in parallel are transistors for which the conduction paths are parallel. For example, all the source electrodes of the transistors are connected to one another, and all the drain electrodes are connected to one another.

Figure 2A:
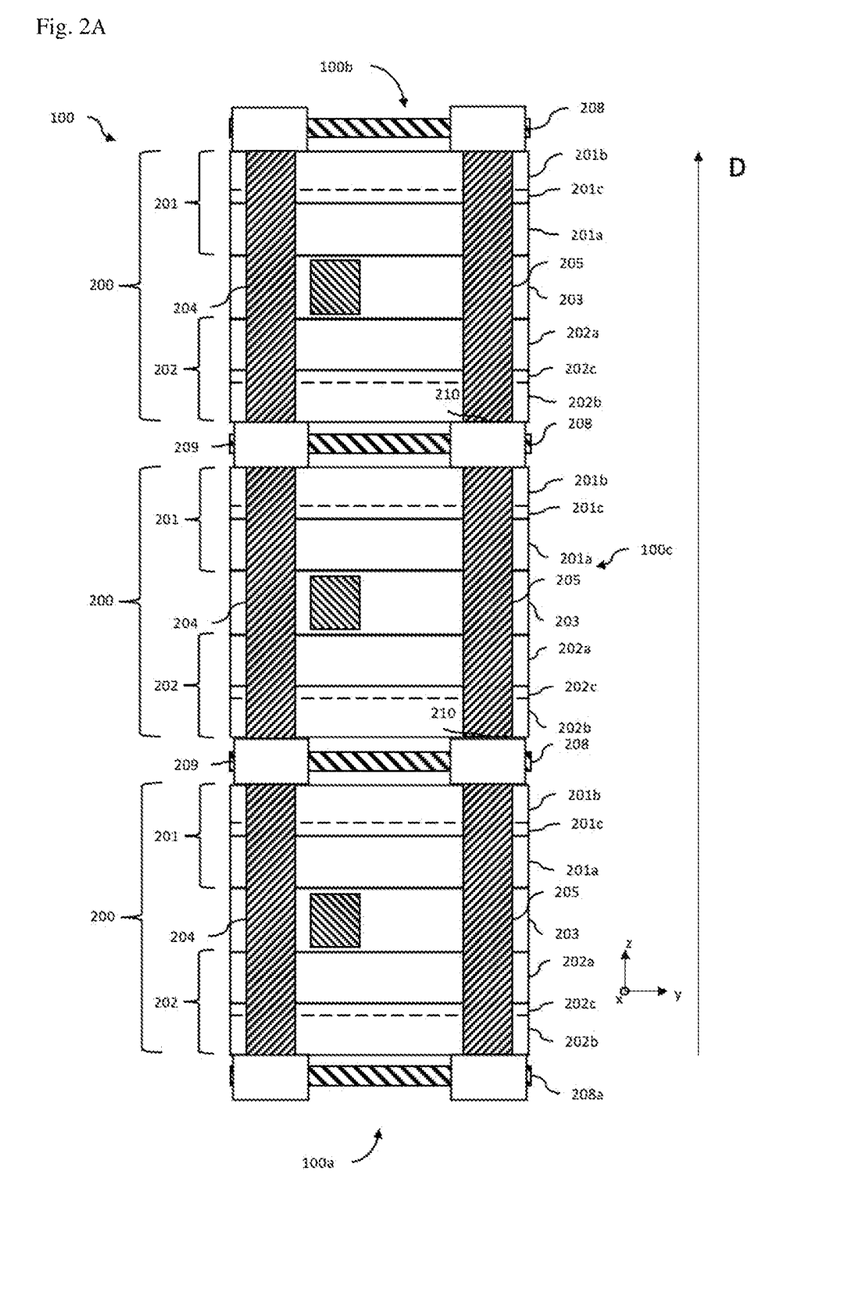
FIG. 2A is a simplified representation, along a longitudinal cross-section plane cutting the active area, of an electronic assembly according to the present disclosure.
Figure 2B:
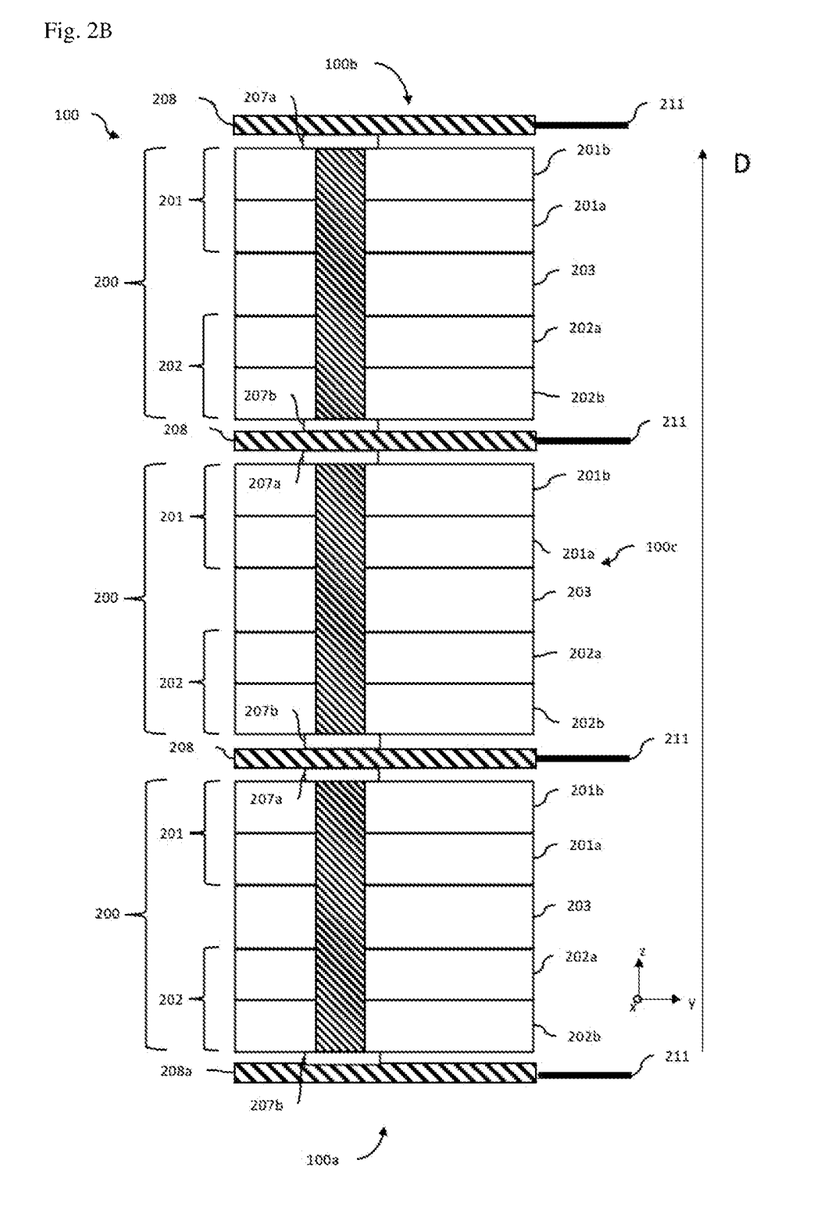
FIG. 2B is a simplified representation, along a longitudinal cross-section plane outside of the active area, of an electronic assembly according to the present disclosure.

FIG. 2A and FIG. 2B show simplified representations along a longitudinal cross-section plane of an electronic assembly 100 according to the present disclosure.

Electronic assembly 100, for example, extends along a stacking direction D, from a lower surface 100a to an upper surface 100b. Lower surface 100a and upper surface 100b are coupled by an edge surface 100c.

Electronic assembly 100 comprises a stack of at least two elementary modules 200 (for example three elementary modules shown in FIG. 2A and FIG. 2B).

Figure 3A:
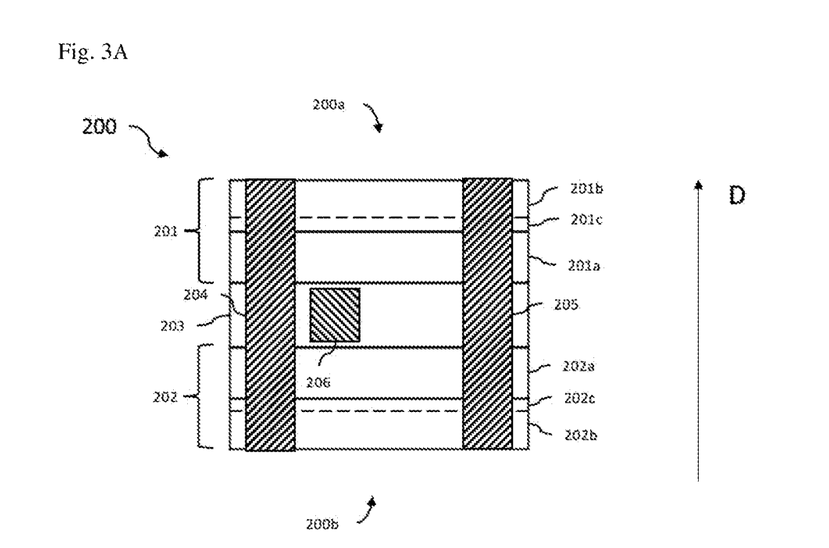
FIG. 3A is a simplified representation of an elementary module, along a cross-section plane cutting the active area, according to the present disclosure.
Figure 3B:
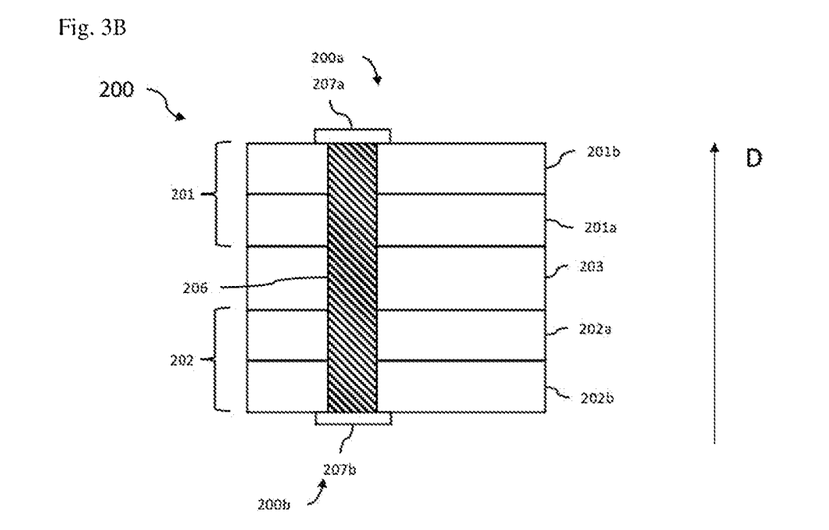
FIG. 3B is a simplified representation of an elementary module, along a cross-section plane outside of the active area, according to the present disclosure.

FIG. 3A and FIG. 3B show in this respect an elementary module 200 according to the terms of the present disclosure. The latter comprises two high electron mobility transistors (hereafter, "HEMT transistor"). For example, elementary module 200 comprises, from a back side 200b to a front side 200a, and along stacking direction D, a back transistor 202 and a front transistor 201 separated by an insulator 203. Insulator layer 203 may, in some implementations, comprise silicon dioxide or silicon nitride.

Front transistor 201 and back transistor 202 each comprise a stack of layers respectively referred to as "front stack" and "back stack" for descriptive purposes. Each of these stacks may for example comprise group-III-V semiconductor materials, and for example group-III-N semiconductor materials. The group-III-V semiconductor materials may in particular be selected from among gallium nitride (GaN), aluminum nitride (AlN), and their AlxGa1-xN ternary alloys, or from among gallium arsenide (GaAs) and its compounds (AlGaAs, InGaAs).

The front stack and the back stack each comprise a barrier layer and a channel layer. For example, the front stack comprises, from insulator layer 203 to front side 200a, a front barrier layer 201a and a front channel layer 201b. For example, the back stack comprises, from insulator layer 203 to back side 200b, a back barrier layer 202a and a back-channel layer 202b.

As an example, and according to the present disclosure, a barrier layer may comprise an AlxGa1-xN ternary alloy while a channel layer may comprise GaN.

Further, a barrier layer may have a thickness in the range from 1 nm to 100 nm. A channel layer may have a thickness in the range from 10 nm to 2 µm.

The front stack and the back stack, according to the present disclosure, are each capable of forming a two-dimensional electron gas layer or region (2DEG), which forms a conduction layer or region.

The conduction layer or region, within a stack, extends in the channel layer, from the interface formed between the barrier layer and the channel layer of the considered stack.

In some implementations, the front stack comprises a front conduction layer or region 201c which extends in front channel layer 201b, from a front interface formed between front barrier layer 201a and front channel layer 201b.

Equivalently, the back stack comprises a back conduction layer 202c which extends in back-channel layer 202b, from a back interface formed between back barrier layer 202a and back-channel layer 202b.

Within an elementary module 200, front transistor 201 and back transistor 202 have in common a source electrode 204, a drain electrode 205, and a gate electrode 206.

In particular, source electrode 204 and drain electrode 205 cross insulator layer 203, and each extend on either side of said insulating layer 203 to, each, electrically contact front conduction layer 201c and back conduction layer 202c.

As illustrated in FIG. 2A, the assembly also comprises source connection means 209 and drain connection means 210.

For example, the source connection means are each interposed between two adjacent elementary modules to electrically connect to each other their source electrodes. Thus, all the source electrodes are connected to one another.

Equivalently, the drain connection means 210 are each interposed between two adjacent elementary modules to electrically connect their drain electrodes to each other. Thus, all the drain electrodes are connected to one another.

The source and drain connection means may comprise pads, for example pads comprising a doped semiconductor material, for example, doped silicon.

The source pads and the drain pads may be stratified and each comprise a stack, along the stacking direction, of elementary pads.

Figure 4:
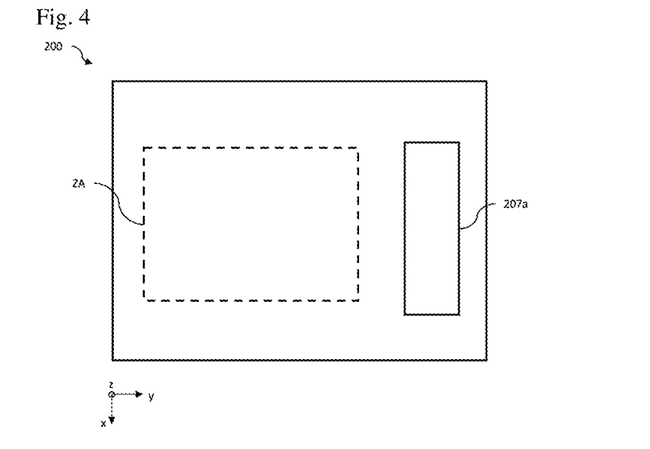
FIG. 4 is a representation illustrating the offset positioning of the gate pad enabling to electrically connect the gate electrode of the elementary module of FIG. 3A according to a front side view of said device.

Gate electrode 206 extends along direction D and remains distant, in an active area ZA of the elementary module, from one and the other of the front conduction layer 201c and of the back conduction layer 202c. Active area ZA is a delimited area of an elementary module 200 where front conduction layer 201c and back conduction layer 202c are likely to ensure a flowing of the current from source electrode 204 to drain electrode 205. Active area ZA (FIG. 4), in projection on one and the other of the front side 200a and of the back side 200b, may take the shape of a rectangle or of a square. The disclosure should however not be limited to this consideration only and those skilled in the art, according to the constraints that they may be imposed, may consider any other shape of active area ZA.

Outside of the active area (FIG. 3B), gate electrode 206 integrally crosses the front stack and the back stack.

Elementary module 200 may comprise, outside of active area ZA, on its front side 200a and its back side 200b, respectively, a front gate pad 207a and, possibly, a back gate pad 207b (FIG. 2B and FIG. 3B). Front gate pad 207a and back gate pad 207b are for example arranged to allow an electric contact with gate electrode 206 on front side 200a and back side 200b. Front gate pad 207a and back gate pad 207b may comprise a doped semiconductor material, for example, doped silicon.

Gate electrode 206 is thus arranged to drive or control the state of one and the other of front transistor 201 and of back transistor 202. For example, this control is executed by imposing an electric potential Vg to gate electrode 206, and for example an electric potential difference DDP, noted Vg-Vs, between gate electrode 206 and source electrode 204.

Thus, as soon as Vg-Vs is greater than a threshold voltage Vth characteristic of each of transistors 201 and 202, both transistors 201 and 202 are in the conductive state. Conversely, as soon as Vg-Vs is smaller than Vth, transistors 201 and 202 are in the non-conductive state, and thus behave as off switches.

In some implementations, the front transistor and the back transistor have an identical threshold voltage Vth.

Thus, when front transistor 201 and back transistor 202 are in the on state, the current flowing between source electrode 204 and drain electrode 205 takes two parallel conduction paths formed by front conduction layer 201c and back conduction layer 202c. The implementation of the source connection means and of the drain connection means enables to parallelize all the front transistors and back transistors. Thus, and according to this architecture, as soon as all the front and back transistors are in a conductive state, the conduction layers formed by the latter are electrically connected in parallel.

Electronic assembly 100 also comprises at least one contact layer 208.

For example, each contact layer 208 is arranged on the front side (or back side) of an elementary module 200 to electrically contact the front gate pad 207a of the considered module. Each contact layer 208 is for example configured to impose a potential Vg to the gate electrode with which it is in electric contact. In other words, contact layer 208 is configured to impose the switching from one of the conductive and non-conductive state to the other of these two states to the front and back transistors of the elementary module having said contact layer associated therewith.

Further, a contact layer 208, called first contact layer, resting on the front side of a given elementary module, called first module, may also be in contact with the gate electrode of another elementary module, called second module, immediately adjacent to the first module. The contact between the first contact layer and the gate electrode of the second module occurs from the back side (for example via back gate pad 207b) of said second module.

It should be noted that the implementation of front gate pad 207a and of back gate pad 207b is not strictly necessary. In other words, it is possible to envisage a direct contact between contact layer 208 and gate electrode 206.

It should further be clear that the stack formed by all the elementary modules ends on the front side (or back side) with one of the contact layers.

A lower contact layer 208a may also be considered. The latter is for example arranged on the back side of an elementary module, called lower module, the first one in the order of the elementary modules along the stacking direction. This lower contact layer is for example arranged to contact on the back side the gate electrode 206 of the lower module.

Thus, according to this arrangement, all the front transistors 201 and back transistors 202 are connected in parallel. For example, as soon as the front transistors and the back transistors are in the conductive state, the front conduction layers and the back conduction layers form an assembly of parallel conduction paths.

In some implementations, as soon as the potential difference Vg−Vs imposed between the gate electrodes and the source electrodes is greater than threshold voltage Vth, all the front transistors and back transistors are in the conductive state.

In the provided architecture, and since the conduction layers are connected in parallel, it is possible to consider the flowing of a greater current density than in known devices of the state of the art. Indeed, if each of the front transistors and of the back transistors have the same on-state resistance Ron, the on-state resistance Ron of the electronic assembly is equal to resistance Ron/(2n), where n is the number of considered electronic modules.

In some implementations, it is possible, by simple stacking of high electron mobility transistors, to obtain an electronic device of lower on-state resistance without having to modify the geometric characteristics of said transistors.

Further, according to the present disclosure, the contact layers, and the lower contact layer (if any), emerge onto the edge surface of the electronic assembly. For example, each of the contact layers comprises a contact point 211 on the edge surface. This arrangement, in some implementations, enables to impose a common potential Vg at the level of each of contact points 211 when all the front transistors and back transistors have to be switched from one of the conductive state and of the non-conductive state to the other of these states. This architecture thus enables to limit heating problems if a single contact point had to be considered to induce the above-mentioned switching.

Finally, the contact layers, generally made of metal and, in some implementations, of copper, also play the role of heat sinks.

Such an electronic assembly is, in some implementations, implemented as soon as very high currents are required. For example, the electronic assembly according to the present disclosure is, in some implementations, implemented in a very high current converter, in industrial motors, in presses, in rotary printing presses, in mountain lifts.

Of course, the disclosure is not limited to the described embodiments and alternative embodiments may be brought thereto without departing from the framework of the disclosure.

Electronic assembly (100) which extends along a stacking direction from a lower surface (100a) to an upper surface (100b) coupled by an edge surface (100c), the assembly may be summarized as including at least two elementary modules (200) stacked along the stacking direction, which each includes, along the stacking direction and from a back side (200b) to a front side (200a), two high electron mobility transistors respectively called back transistor (202) and front transistor (201), separated by an insulator layer (203), and having in common a source electrode (204), a drain electrode (205), and a gate electrode (206), the assembly of the front and back transistors being electrically connected in parallel, the electronic assembly (100) includes, arranged on the front side (200a) of each elementary module, a contact layer (208), electrically contacting the gate electrode (206) of the considered elementary module on its front side (200a), each of the contact layers (208) including an electric contact point (211) emerging onto the edge surface.

A contact layer (208) interposed between two elementary modules (200), may be called, according to the stacking direction, first module and second module, also contacts, on the back side (200b) of the second module, the gate electrode (206) of said second module.

Said electronic assembly (100) may include source connection means and drain connection means arranged to connect in parallel all the front transistors and back transistors (202).

The source connection means may include source pads (209), each source pad (209) being interposed between two adjacent electronic modules to electrically connect the source electrodes of the considered electronic modules.

The drain connection means may include drain pads (210), each drain pad being interposed between two adjacent electronic modules to electrically connect the drain electrodes of the considered electronic modules.

The front transistor (201) and the back transistor (202) respectively may include a front stack and a back stack, the front stack may include, from the insulator layer (203) to the front side (200a), a front barrier layer (201a) and a front channel layer (201b), and the back stack may include from the insulator layer (203) to the back side (200b) a back barrier layer (202a) and a back channel layer (202b), the front channel layer and the back channel layer being each capable of forming a conduction layer (201c, 202c) in the form of a two-dimensional electron gas.

The front stack and the back stack may be essentially identical.

The front and back transistors may have an identical threshold voltage.

The front channel layer and the back-channel layer may include GaN and the front barrier layer and the back barrier layer may include an AlGaN ternary alloy.

The insulator layer (203) may include a dielectric material, and in some implementations, silicon dioxide or silicon nitride.

The contact layer (208) may include a metal element, and in some implementations the metal element comprises copper.

Said assembly also may include a lower contact layer (208) arranged on the back side (200b) of an elementary module, called lower module, the first one in the order of the elementary modules (200) along the stacking direction, the lower contact layer (208) is arranged to contact, from the back side (200b), the gate electrode (206) of the lower module.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic assembly, the assembly comprising:
    at least two elementary modules stacked along a stacking direction;
    at least two first contact layers corresponding to the at least two elementary modules, respectively,
    wherein each elementary module of the at least two elementary modules includes:
        along the stacking direction and from a second side to a first side of the elementary module, a second high electron mobility (HEMT) transistor and a first HEMT transistor, the first HEMT transistor and the second HEMT transistor having in common a source electrode, a drain electrode, and a gate electrode; and
        an insulator layer between the first HEMT transistor and the second HEMT transistor, the drain electrode being surrounded by the insulator layer and separated from the at least two first contact layers along the stacking direction; and
        wherein each first contact layer of the at least two first contact layers is in contact with a gate electrode of a respective elementary module on a first side of the respective elementary module, and includes an electric contact point emerging beyond an edge surface of the respective elementary module.

2. The electronic assembly according to claim 1, wherein a first contact layer of the at least two contact layers is interposed between a first module and a second module of the at least two elementary modules, and the first contact layer contacts, on a first side of the first module, a gate electrode of the first module, and contacts, on a second side of the second module, a gate electrode of the second module, the first side of the first module facing the second side of the second module.

3. The electronic assembly according to claim 1, further comprising source connection means and drain connection means arranged to connect in parallel all first transistors and second transistors of the at least two elementary modules.

4. The electronic assembly according to claim 3, wherein the source connection means includes source pads, each source pad being interposed between two adjacent electronic modules and in connect with source electrodes of the two adjacent electronic modules.

5. The electronic assembly according to claim 3, wherein the drain connection means includes drain pads, each drain pad being interposed between two adjacent electronic modules and in connect with drain electrodes of the two adjacent electronic modules.

6. The electronic assembly according to claim 1, wherein the first HEMT transistor and the second HEMT transistor include a first stack of layers and a second stack layers, respectively, the first stack of layers including, from the insulator layer to the first side, a first barrier layer and a first channel layer, and the second stack of layers including from the insulator layer to the second side a second barrier layer and a second channel layer, the first channel layer and the second channel layer being each capable of forming a conduction region of a two-dimensional electron gas.

7. The electronic assembly according to claim 6, wherein the first stack of layers and the second stack of layers mirror one another.

8. The electronic assembly according to claim 6, wherein the first HEMT transistor and the second HEMT transistor have a same threshold voltage.

9. The electronic assembly according to claim 6, wherein the first channel layer and the second channel layer each includes GaN, and the first barrier layer and the second barrier layer each includes an AlGaN ternary alloy.

10. The electronic assembly according to claim 1, wherein the insulator layer includes one or more of silicon dioxide or silicon nitride.

11. The electronic assembly according to claim 1, wherein the at least two contact layers each includes copper.

12. The electronic assembly according to claim 1, further comprising a second contact layer arranged on a second side of an elementary module of the at least two elementary modules, the second side of the elementary module opposite a first surface of the elementary module, the second contact layer in contact with, from the second side of the elementary module, a gate electrode of the elementary module.

13. A structure, comprising:
    a first high electron mobility (HEMT) transistor and a second HEMT transistor along a stacking direction, the first HEMT transistor and the second HEMT transistor having in common a source electrode, a drain electrode, and a gate electrode;
    an insulator layer between the first HEMT transistor and the second HEMT transistor in the stacking direction, the drain electrode being surrounded by the insulator layer; and
    a contact layer coupled to the gate electrode, the contact layer extending transverse to the stacking direction and overlapping the source electrode, the drain electrode, and the gate electrode along the stacking direction.

14. The structure according to claim 13, wherein the contact layer is in contact with the gate electrode on a first side of the first HEMT transistor, and includes an electric contact point emerging beyond an edge surface of the first HEMT transistor, the first side of the first HEMT transistor distal to the insulator layer.

15. The structure according to claim 13, wherein the first HEMT transistor and the second HEMT transistor include a first stack of layers and a second stack layers, respectively, the first stack of layers including, from the insulator layer, a first barrier layer and a first channel layer, and the second stack of layers including from the insulator layer, a second barrier layer and a second channel layer, the first channel layer and the second channel layer each configured to form a conduction region of a two-dimensional electron gas.

16. The structure according to claim 15, wherein the conduction region of the two-dimensional electron gas is adjacent to an interface between a channel layer and a respective barrier layer.

17. The structure according to claim 15, wherein the first channel layer and the second channel layer each includes GaN.

18. The structure according to claim 15, wherein the first barrier layer and the second barrier layer each includes an AlGaN ternary alloy.

19. A method, comprising:
- stacking a first module over a second module along a first direction, each of the first module and the second module including:
  - a first high electron mobility (HEMT) transistor and a second HEMT transistor arranged along the first direction, the first HEMT transistor and the second HEMT transistor having in common a source electrode, a drain electrode, and a gate electrode;
  - an insulator layer between the first HEMT transistor and the second HEMT transistor along the first direction, the drain electrode being surrounded by the insulator layer; and
  - a contact layer coupled to the gate electrode, the contact layer extending transverse to the first direction and overlapping the source electrode, the gate electrode, and the drain electrode along the first direction; and
- coupling the source electrode, drain electrode, and gate electrode of the first module to the source electrode, drain electrode, and gate electrode of the second module, respectively.

20. The method according to claim 19, wherein the first HEMT transistor and the second HEMT transistor each includes a channel layer of GaN.

* * * * *